US006960280B2

(12) United States Patent
Kado

(10) Patent No.: US 6,960,280 B2
(45) Date of Patent: Nov. 1, 2005

(54) METHOD OF FORMING A SURFACE COATING HAVING HIGH SURFACE HARDNESS ON A METAL, ALLOY OR CERAMIC SUBSTRATE

(75) Inventor: Tetsuo Kado, Kure (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 67 days.

(21) Appl. No.: 10/364,352

(22) Filed: Feb. 12, 2003

(65) Prior Publication Data

US 2003/0150713 A1  Aug. 14, 2003

(30) Foreign Application Priority Data

Feb. 13, 2002  (JP) .............................. 2002-035448

(51) Int. Cl.[7] .......................... C23C 14/34; C23C 16/00
(52) U.S. Cl. ........................... 204/192.16; 204/192.15; 427/530; 427/554; 427/249.17; 427/249.18
(58) Field of Search ................. 204/192.12, 192.15, 204/192.16, 192.17, 192.22; 427/530, 249.17, 427/249.18, 554

(56) References Cited

U.S. PATENT DOCUMENTS 5,538,816 A * 7/1996 Hashimoto et al. ............ 430/5

6,285,424 B1 * 9/2001 Yoshida ...................... 349/110

OTHER PUBLICATIONS

Fan et al., "Chromium Oxycarbide Thin Films Prepared by Inductively Coupled RadioFrequency Plasma Assisted . . . ", Journal o the American Ceramic Society, Aug. 2001, vol. 84, Issue 8 beginning p. 1763.*

* cited by examiner

Primary Examiner—Rodney G. McDonald
(74) Attorney, Agent, or Firm—Sughrue Mion, PLLC

(57) ABSTRACT

The present invention provides a method of forming a surface coating having a micro-Vickers hardness of about 1600 kgf/mm$^2$ or more on a substrate made of metal, alloy or ceramic. The method comprises subjecting the substrate to a reactive plasma process which uses a target material consisting of tungsten or its alloy, a sputtering gas consisting of argon, and at least one reactive gas selected firm the group consisting of carbon dioxide and carbon monoxide, to form a tungsten oxycarbide coating on the surface of the substrate, wherein the reactive plasma process is performed additionally using at least one noble gas selected from the group consisting of helium, neon, krypton and radon, as an auxiliary gas, while maintaining the substrate at a temperature in the range of about 550 to 680 K. The method of the present invention can form a tungsten oxycarbide coating having a desirably enhanced surface hardness equivalent to that of a chromium or molybdenum oxycarbide coating on the surface of a metal, alloy or ceramics substrate without degrading the original properties of the substrate.

15 Claims, 2 Drawing Sheets

METHOD OF FORMING A SURFACE COATING HAVING HIGH SURFACE HARDNESS ON A METAL, ALLOY OR CERAMIC SUBSTRATE

FIELD OF THE INVENTION

The present invention relates to a method of forming a surface coating having a high surface hardness on a substrate made of metal, alloy or ceramic and, more particularly, to a method of forming a tungsten oxycarbide coating on the surface of a substrate made of metal, alloy or ceramics under a relatively low temperature of about 680 K or less to provide a metal, alloy or ceramic product, such as machine tools, dies or machine parts, having a high surface hardness of about 1600 kgf/mm$^2$ or more.

BACKGROUND OF THE INVENTION

A technique, known as hard coating, of coating the surface of machine tools, dies or machine parts with a high surface hardness material excellent in wear, welding and/or corrosion resistance has been widely used to provide enhanced cutting performance of machine tools, extended life of dies and improved wear and corrosion resistances of machine parts.

Metal oxycarbides such as chromium, molybdenum or tungsten oxycarbide have been known as a material for the hard surface coating. In particular, chromium oxycarbide is regarded as one noteworthy hard coating material of machine tools, because it has a micro-Vickers hardness of 2800 kgf/mm$^2$ or more, comparatively superior to a micro-Vickers hardness of 2200 kgf/mm$^2$ in titanium nitride, and excellent corrosion resistance/anti-corrosion performance against hydrochloric acid and vitriolic acid, as well as enhanced cutting performance in high-speed, steel throw-away chips.

Such metal oxycarbide coatings have been typically formed through a plasma CVD method or thermal CVD method using metal hexacarbonyls such as Cr (CO)$_6$, W (CO)$_6$ or MO (CO)$_6$ as a raw material. However, metal hexacarbonyls are expensive, and toxic. In addition, most metal hexacarbonyls are solids under normal temperature and pressure, and are typically used through a process of enclosing solid metal hexacarbonyl in a container, sublimating it in the container, and introducing the sublimed metal hexacarbonyl to a reaction chamber through a duct. Thus, it is difficult to maintain the supply of the raw material gas in a constant amount, because the amount of sublimation is reduced as the remaining amount of the raw material decreases. Further, metal oxycarbides are incomplete decomposition products from metal hexacarbonyls, and thereby a soot-like decomposition product is undesirably deposited on the duct and/or the reaction chamber, which disturbs a smooth reaction.

In order to form a metal oxycarbide coating without using harmful metal hexacarbonyls, the inventor previously proposed a method of subjecting a metal substrate to a reactive plasma process under the presence of at least one metal selected from the group consisting of chromium, molybdenum and tungsten, and at least one reactive gas selected from the group consisting of carbon dioxide and carbon monoxide, while maintaining the metal substrate at a temperature in the range of 600 to 780 K, to form a metal oxycarbide coating on the surface of the substrate (Japanese Patent Laid-Open Publication No. 2001-279426).

However, tungsten oxycarbide is inherently less apt to have a sodium chloride crystal structure as compared to chromium oxycarbide or molybdenum oxycarbide, and it is thereby difficult to form a tungsten oxycarbide coating having a desired micro-Vickers hardness of 1600 kgf/mm$^2$ or more through the above method.

SUMMARY OF THE INVENTION

In view of the above problem on the tungsten oxycarbide coating, it is therefore an object of the present invention to provide a method capable of forming a tungsten oxycarbide coating having a desirably enhanced surface hardness equivalent to that of a chromium or molybdenum oxycarbide coating on the surface of a metal, alloy or ceramic substrate without degrading the original properties of the substrate.

As a result of various research for developing a new method of forming a tungsten oxycarbide coating having a high surface hardness through a reactive plasma process, the inventor found that when the reactive plasma process was performed by using at least one reactive gas selected from the group consisting of carbon dioxide and carbon monoxide wherein said reactive gas further comprises lower hydrocarbon, such as methane, in combination with a noble gas as an auxiliary gas, a tungsten oxycarbide coating having a micro-Vickers hardness of about 1600 kgf/mm$^2$ or more could be unexpectedly obtained at a substrate temperature of about 550 to 680 K, and the inventor has completed the present invention based on this knowledge.

Specifically, the present invention provides a method of forming a surface coating having a micro-Vickers hardness of about 1600 kgf/mm$^2$ or more on a substrate made of metal, alloy or ceramic. The method comprises subjecting the substrate to a reactive plasma process which uses a target material consisting of tungsten or an alloy thereof, a sputtering gas consisting of argon, at least one reactive gas selected from the group consisting of carbon dioxide and carbon monoxide, and lower hydrocarbon to form a tungsten oxycarbide coating on the surface of the substrate, wherein the reactive plasma process is performed additionally using at least one noble gas selected from the group consisting of helium, neon, krypton and radon, as an auxiliary gas, while maintaining the substrate at a temperature in the range of about 550 to 680 K.

According to the present invention, a tungsten oxycarbide coating having a desired high surface hardness can be formed on a metal, alloy or ceramic substrate through a simple process by using easily-available materials without using metal carbonyl compounds which are harmful to humans. In addition, the method of the present invention allows the entire process of forming the coating to be performed at a temperature of about 680 K or less which never causes any undesirable change in the crystal structure and dimensions of the substrate. This feature makes it possible to reliably maintain the original properties/performances and dimensions of the substrate so as to provide a desirable product, such as steel machine tools, high-precision machine parts or high-precision dies, with a hard surface coating.

Further, by taking advantage of the excellent corrosion resistance of the tungsten oxycarbide coating, the present invention may be applied to various valves of internal combustion engines or various equipments of chemical plants to be used in a corrosive environment.

DETAILED DESCRIPTION OF THE INVENTION

Figures 1A, 1B, 1C:
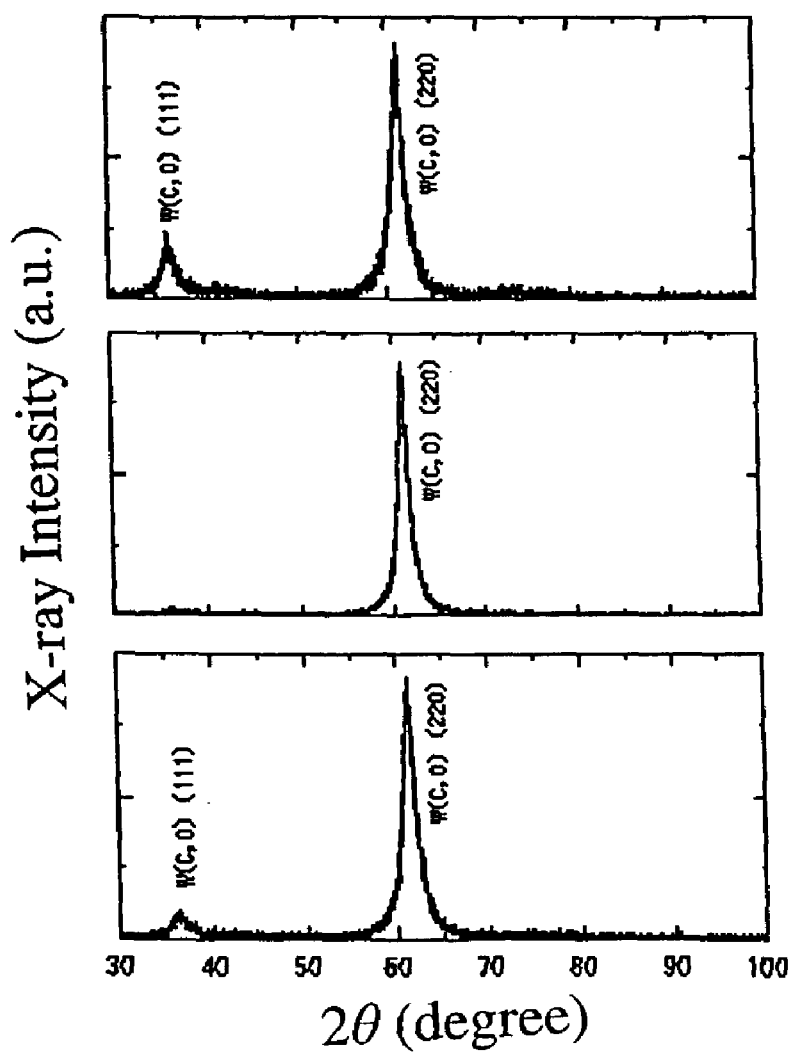
FIGS. 1(a), 1(b) and 1(c) are diagrams showing X-ray diffraction patterns of respective tungsten oxycarbide coatings obtained in Comparative Example, Inventive Example 1 and Inventive Example 2, respectively.

The substrate material to be used in the method of the present invention may include iron such as carbon steel, nickel-chromium steel, nickel-molybdenum steel, silicon-manganese steel, free-cutting steel, tool steel, or stainless steel, or its alloys; nonferrous metal such as copper, silver, gold, tin or aluminum, or its alloys; metal oxides; and ceramics such as, nitride ceramics, oxide ceramics or silicide ceramics.

Tungsten itself or tungsten-based alloys are used as a metal for forming a tungsten oxycarbide coating on the surface of the substrate. Tungsten or tungsten-based alloys may be used independently, or two or more of them may be used in combination with each other.

In the method of the present invention, at least one reactive gas is selected from the group consisting of carbon dioxide and carbon monoxide, i.e. a reactive gas consisting of carbon dioxide itself, carbon monoxide itself or a mixture of carbon dioxide and carbon monoxide. Heretofore, a mixture of carbon dioxide and carbon monoxide has been used to form a tungsten oxycarbide coating containing a larger amount of carbon. In this case, while the carbon content in the coating is increased as the carbon monoxide is used in a larger amount, the carbon monoxide should be used in a minimum amount because of its toxicity or in view of safety considerations. Thus, in the method of the present invention, the amount of carbon monoxide is reduced as much as possible, and lower hydrocarbon is added into the reactive gas as a substitute for the reduced amount of carbon monoxide.

This lower hydrocarbon is preferably hydrocarbon having a carbon number of 4 or less, such as methane, ethane, propane or butane, more preferably methane.

A flow-rate ratio of the lower hydrocarbon to be mixed with the reactive gas to the entire reactive gas, which is the total of the sputtering gas, the reaction gas and the auxiliary gas, is preferably set in the range of 1 to 20%, more preferably 1 to 15%.

Further, in order to adjust the amount of oxygen in the coating to be formed, a small amount of oxygen may be added to the reaction gas according to need. A flow-rate ratio of the oxygen to the entire reactive gas, which is the total of the sputtering gas, the reaction gas and the auxiliary gas, may be set at 10% or less.

In the method of the present invention, argon is used as a sputtering gas, and at least one noble gas selected from the group consisting of helium, neon, krypton and radon is additionally used as the auxiliary gas. The noble gas used as the auxiliary gas provides an enhanced ionization degree of plasma gas to allow a tungsten oxycarbide coating to be formed with a higher surface hardness. A flow-rate ratio of the auxiliary gas to be added to the entire reactive gas, which is the total of the sputtering gas, the reaction gas and the auxiliary gas, is preferably set in the range of 10 to 30%, more preferably 15 to 20%.

In the method of the present invention, the reactive plasma process can be carried out, for example, by a reactive sputtering method, a radio-frequency excitation reactive sputtering method (hereinafter referred to as "RF reactive sputtering method"), a reactive ion plating method, or a reactive vapor deposition method or a reactive laser ablation method under plasma atmosphere.

In order to enhance the quality of a film or coating to be formed, the reactive sputtering method may be carried out while applying a negative DC bias to a substrate electrode without grounding the substrate electrode. The RF reactive sputtering method may be carried out by using a sputtering apparatus having a planar magnetron-type target electrode. In this case, the coating quality can be more enhanced by incorporating therein an inductive coupling-type RF electrode as an additional plasma generating system.

The reactive plasma process is carried out while maintaining a substrate temperature in the range of about 550 to 680 K. If the substrate temperature is substantially out of this range, it will be unable to form a coating with a sufficient deposition rate, resulting in deteriorated hardness of the coating.

In the method of the present invention, the surface of the substrate is preferably bombarded in advance by an argon gas or a mixed gas consisting of argon and hydrogen, to enhance the adhesion between the substrate and a coating to be formed thereon. The bombardment may be carried out under the conditions of a vacuum degree of about 50 to 150 Pa, an RF power of about 50 to 400 W, an argon flow rate of about 20 to 150 sccm, a substrate bias of about −50 to −400 V, and a substrate temperature of about 450 to 780 K, to reliably prevent a coating formed on the substrate from peeling off therefrom. More preferably, the bombardment is carried out for about 15 to 30 minutes under the conditions of a vacuum degree of about 120 Pa, an RF power of about 110 W, an argon flow rate of about 50 sccm, a substrate bias of about −150 V, and a substrate temperature of about 673 K, to achieve the optimum adhesion between the substrate and a coating formed thereon After the bombardment, the method of the present invention may be implemented by subjecting the substrate to a reactive plasma process under the conditions of a vacuum degree of about 0.1 to 2 Pa, preferably about 0.3 Pa; an RF power of about 10 to 150 W, preferably about 40 W; a sputtering power-supply output of about 0.2 to 1.0 kW, preferably about 0.3 kW; a substrate bias of about 0 to −400 V, preferably about −250 V; a substrate temperature of about 550 to 680 K, preferably about 673 K, while applying a mixed gas containing argon, carbon dioxide, methane and helium to the substrate under the conditions of an argon flow rate of about 5 to 10 sccm, preferably about 6 sccm; a carbon dioxide flow rate of about 1 to 4 sccm, preferably about 3 sccm; a methane flow rate of about 0.1 to 1 sccm, preferably about 0.5 sccm; and a helium flow rate of about 1 to 3 sccm, preferably about 2.1 sccm. A tungsten oxycarbide coating having a thickness of about 1 to 1.8 μm can be obtained by subjecting the substrate to the reactive plasma process under the above conditions for about 60 minutes.

EXAMPLES

While the present invention will be described in more detail in conjunction with the following Examples, it should be understood that the present invention is not construed as being limited to these Examples. Unless otherwise indicated, all the parts and percents are by weight.

Comparative Example

A deposition apparatus having an RF electrode composed of a 3-turn coil capable of generating plasma at a radio frequency of 13.56 MHz independently of a sputtering electrode was used. In the deposition apparatus, tungsten is used as the material of a planar magnetron-type target electrode, and a stainless steel (SUS 304) substrate is placed above the target electrode by about 10 cm. The substrate was subjected to an RF-activated reactive sputtering process under the following conditions.

Vacuum degree: 0.3 Pa
Sputtering power-supply output: 0.3 kW
Substrate Temperature: 673 K
RF power: 40 W
Substrate bias: −250 V
Gas flow rate: Ar 6 sccm, $CO_2$ 3 sccm
Processing time: 2 hours In this way, a metallic-lustrous tungsten oxycarbide coating having a thickness of 2.3 µm was formed on the surface of the substrate. This surface had a micro-Vickers hardness of 1300 $kgf/mm^2$. An X-ray diffraction pattern of the tungsten oxycarbide coating obtained in this Example is shown in FIG. 1(a).

Inventive Example 1

Experimental tests were repeatedly performed by changing the flow rates in the Comparative Example to Ar 6 sccm and $CO_2$ 3 sccm, and adding helium as the auxiliary gas into these gases in various flow rates while maintaining the other conditions of the Comparative Example. The respective micro-Vickers hardnesses of tungsten oxycarbide coatings obtained in these tests are shown by a solid line in the graph of FIG. 2.

Figure 2:
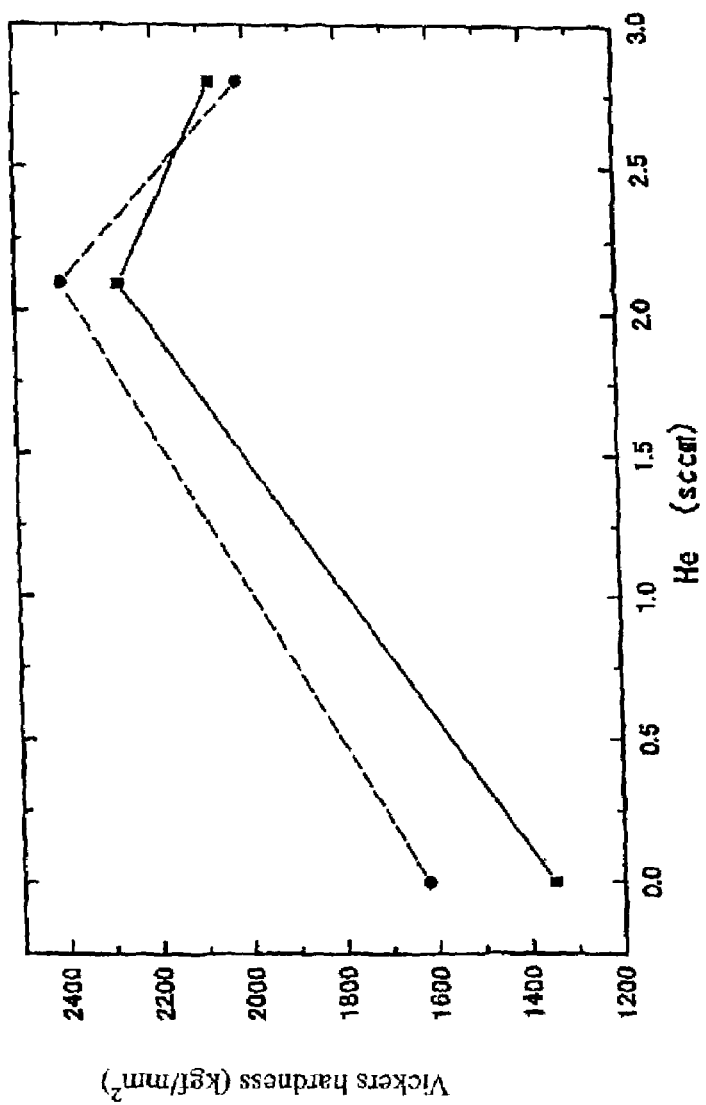
FIG. 2 is a graph showing the relationship between the flow rate of helium and the Vickers hardness of a tungsten oxycarbide coating obtained in each of Inventive Example 1 (indicated by a solid line) and Inventive Example 2 (indicated by a broken line).

As seem from the graph of FIG. 2, the helium added as the auxiliary gas allows the micro-Vickers hardness of the obtained tungsten oxycarbide coating to be significantly increased by up to about 2400 $kgf/mm^2$ at a He flow rate of 2.1 sccm.

Inventive Example 2

Experimental tests were repeatedly performed by changing the flow rates in Inventive Example 1 to Ar 6 sccm, $CO_2$ 3 sccm, and $CH_4$ 0.5 sccm while maintaining the other conditions of Inventive Example 1. The relationship between the flow rate of the helium and the Vickers hardness of a tungsten oxycarbide coating obtained in each of the above tests is shown by a broken line in the graph of FIG. 2.

X-ray diffraction patterns of tungsten oxycarbide coatings obtained at helium flow rates of 2.1 sccm and 2.8 sccm in Inventive Example 2 are shown in FIG. 1(b) and FIG. 1(c), respectively. These figures show Bragg reflections from (111) and (220) planes of tungsten oxycarbide W(C, O) having a sodium chloride crystal structure with a lattice constant of 0.427 nm. This proves that tungsten oxycarbide W(C, O) can be formed through the method of the present invention, and the tungsten oxycarbide W(C, O) obtained under the condition of a helium flow rate of 2.1 sccm with the highest micro-Vickers hardness has the largest intensity ratio of the (220) Bragg reflection.

Inventive Example 3

As a substitute for argon in Inventive Example 1, neon (Ne) was added as the auxiliary gas at a flow rate of 2.1 sccm. A resulting tungsten oxycarbide coating had a significantly enhanced micro-Vickers hardness of 2200 $kgf/mm^2$.

Inventive Example 4

As a substitute for argon in Inventive Example 1, krypton (Kr) was added as the auxiliary gas at respective flow rates of 2.1 sccm and 2.8 sccm. Resulting tungsten oxycarbide coatings had significantly enhanced micro-Vickers hardnesses of 2350 $kgf/mm^2$ for the flow rate of 2.1 sccm and 2303 $kgf/mm^2$ for the flow rate of 2.8 sccm.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

What is claimed is:

1. A method of forming a surface coating on a substrate made of metal, alloy or ceramic, comprising the steps of:
    subjecting said substrate to a reactive plasma process which uses a target material consisting of tungsten or its alloy, a sputtering gas consisting of argon, and at least one reactive gas selected from the group consisting of carbon dioxide and carbon monoxide, to form a tungsten oxycarbide coating on the surface of said substrate, wherein said reactive plasma process is performed additionally using at least one noble gas selected from the group consisting of helium, neon, krypton and radon, as an auxiliary gas, while maintaining said substrate at a temperature in the range of about 550 to 680 K wherein said tungsten oxycarbide coating has a micro-Vickers hardness of about 1600 $kgf/mm^2$ or more.

2. The method as defined in claim 1, wherein said reactive gas further comprises lower hydrocarbon.

3. The method as defined in claim 2, wherein said lower hydrocarbon is methane.

4. The method as defined in claim 1 or 2, wherein said reactive gas further comprises oxygen.

5. The method as defined in claim 2 or 3, wherein a flow-rate ratio of said lower hydrocarbon to be mixed with the reactive gas to the entire reactive gas, which is the total of the sputtering gas, the reaction gas and the auxiliary gas, is in the range of 1 to 20%.

6. The method as defined in any one of claims 1 to 3, wherein a flow-rate ratio of said auxiliary gas to the entire reactive gas, which is the total of the sputtering gas, the reaction gas and the auxiliary gas, is in the range of 10 to 30%.

7. The method as defined in claim 4, wherein a flow-rate ratio of said auxiliary gas to the entire reactive gas, which is the total of the sputtering gas, the reaction gas and the auxiliary gas, is in the range of 10 to 30%.

8. The method as defined in claim 1, wherein the thickness of said tungsten oxycarbide coating is from 0.5 to 5 µm.

9. The method as defined in claim 1, wherein planes of said tungsten oxycarbide coating have a sodium chloride crystal structure with a lattice constant of 0.427±0.005 nm.

10. The method as defined in claim 1, wherein said reactive plasma process is a reactive sputtering method, a radio-frequency excitation reactive sputtering method, a reactive ion plating method, a reactive vapor deposition method.

11. The method as defined in claim 10, wherein said reactive plasma process is a reactive sputtering method.

12. The method as defined in claim 11, wherein said reactive sputtering method is carried out while applying a negative DC bias to a substrate electrode without grounding said substrate electrode.

13. The method as defined in claim 10, wherein said reactive plasma process is a radio-frequency excitation reactive sputtering method.

14. The method as defined in claim 13, wherein said radio-frequency excitation reactive sputtering method is carried out by using a sputtering apparatus having a planar magnetron-type target electrode.

15. The method as defined in claim 14, wherein said radio-frequency excitation reactive sputtering method is a DC sputtering method enhanced by incorporating therein an inductive coupling-type radio-frequency electrode as an additional plasma generating system.

* * * * *